United States Patent
Shimizu et al.

(10) Patent No.: US 9,859,195 B1
(45) Date of Patent: Jan. 2, 2018

(54) SEMICONDUCTOR DEVICE

(71) Applicant: Mitsubishi Electric Corporation, Tokyo (JP)

(72) Inventors: Yasutaka Shimizu, Tokyo (JP); Yoshitaka Otsubo, Tokyo (JP); Mituharu Tabata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/473,824

(22) Filed: Mar. 30, 2017

(30) Foreign Application Priority Data

Jul. 1, 2016 (JP) .................... 2016-131706

(51) Int. Cl.
*H01L 23/495* (2006.01)
*H01L 23/00* (2006.01)

(52) U.S. Cl.
CPC .. *H01L 23/49517* (2013.01); *H01L 23/49541* (2013.01); *H01L 23/49562* (2013.01); *H01L 23/49582* (2013.01); *H01L 24/48* (2013.01); *H01L 2224/48175* (2013.01); *H01L 2924/01029* (2013.01)

(58) Field of Classification Search
CPC ......... H01L 23/49541; H01L 23/49562; H01L 23/49582; H01L 24/48
See application file for complete search history.

(56) References Cited

U.S. PATENT DOCUMENTS

2003/0146501 A1* 8/2003 Sasaki ............... H01L 23/49861
257/692
2013/0082283 A1* 4/2013 Otsuki ................... H01L 24/49
257/77

FOREIGN PATENT DOCUMENTS

JP 2006-196765 A 7/2006

* cited by examiner

*Primary Examiner* — Cuong Q Nguyen
(74) *Attorney, Agent, or Firm* — Studebaker & Brackett PC

(57) ABSTRACT

A semiconductor device includes: a circuit pattern, at least one or more wires joined thereto, an electrode terminal joining thereto, and a semiconductor element. The electrode terminal includes a horizontally extending portion extending along a main surface and connected to the wire, and a bent portion at which an extending direction of the electrode terminal is changed relative to the horizontally extending portion. Each of the wires has joint portions at which each of the wires and the circuit pattern are joined to each other. In a plan view, the joint portions are located on an outside of a portion where each of the wires and the electrode terminal overlap each other.

9 Claims, 8 Drawing Sheets

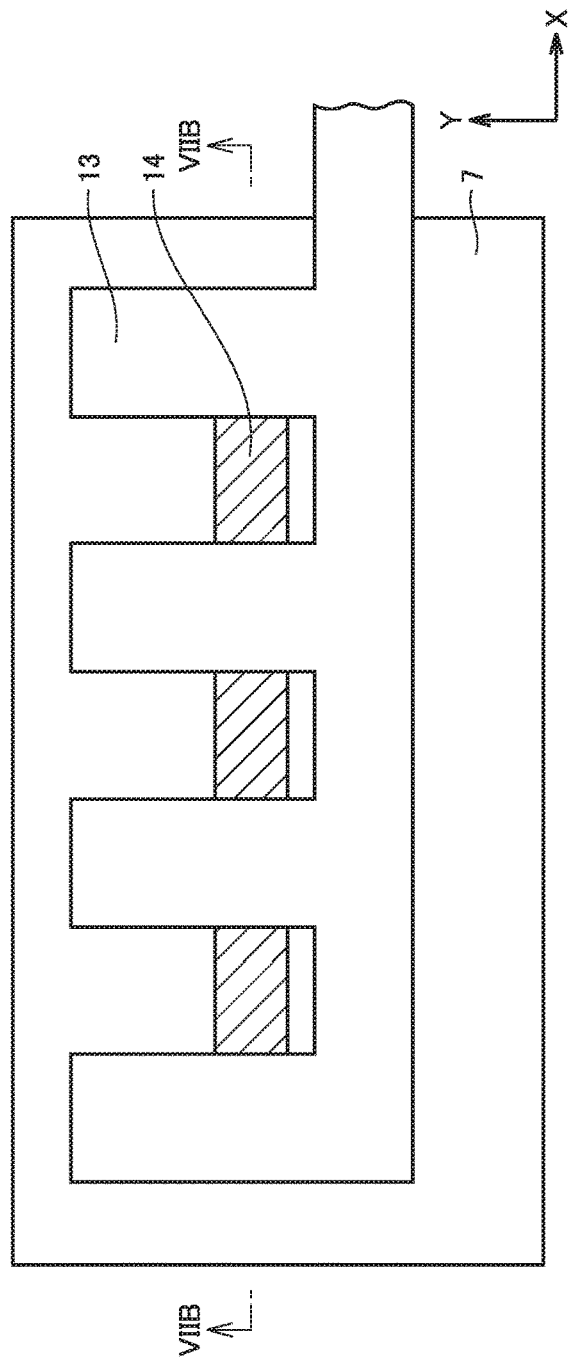
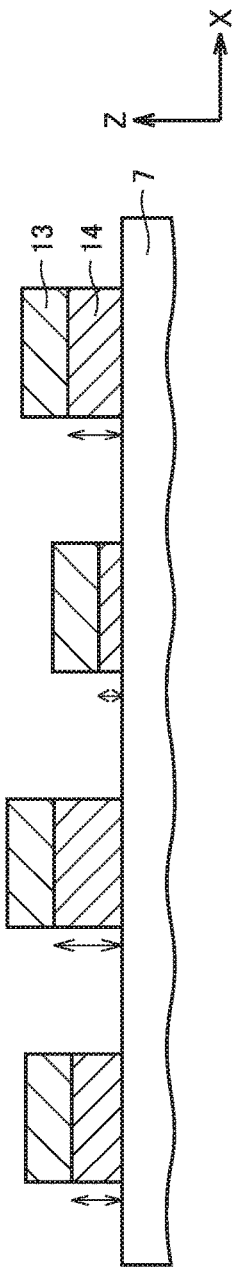
FIG.7A
FIG.7B

SEMICONDUCTOR DEVICE

BACKGROUND OF THE INVENTION

Field of the Invention

The present invention relates to a semiconductor device, and particularly to a semiconductor device utilized in various situations in a range from power generation and power transmission to efficient use and regeneration of energy.

Description of the Background Art

For example, Japanese Patent Laying-Open No. 2006-196765 discloses a conventional semiconductor device in which, for example, a semiconductor element having an electrode formed on each of its front and rear surfaces is electrically connected to a circuit pattern of a circuit substrate. In Japanese Patent Laying-Open No. 2006-196765, the electrode of the semiconductor element and a conductive member are electrically connected to each other through a bump, and the conductive member has a cutout portion. Accordingly, the bump provided so as to extend across the cutout portion in a plan view connects the semiconductor element and the conductive member. Thus, the thermal stress between the bump and the conductive member is absorbed and alleviated by deformation of the cutout portion, thereby improving the reliability of the joint portion between the bump and the conductive member.

SUMMARY OF THE INVENTION

In the technique disclosed in Japanese Patent Laying-Open No. 2006-196765, since a cutout portion is provided in the conductive member, the amount of current that can flow through the conductive member is reduced as compared with the case where a cutout portion is not provided in the conductive member. This is because the cross-sectional area of a portion of the conductor in the conductive member through which a current flows is reduced by such a cutout portion. Thus, since the conductive member needs to be increased in size so as to allow the required current amount to flow therethrough, it becomes difficult to reduce the size of the semiconductor device.

Furthermore, in the technique disclosed in Japanese Patent Laying-Open No. 2006-196765, if the bumps joining the conductive members and the semiconductor elements are irregularly shaped, the bumps are different in thickness when the conductive members and the semiconductor elements are joined to each other. This may cause problems that the electrical characteristics of the joint portion between the conductive member and the semiconductor element may be influenced, and the heat dissipation performance may deteriorate.

The present invention has been made in light of the above-described problems. An object of the present invention is to provide a semiconductor device that can be reduced in size and that is configured to allow reduction of the thickness variations in the joint materials for connecting the semiconductor elements and the electrode terminals.

A semiconductor device according to the present invention includes: a circuit pattern, a wire, an electrode terminal, and a semiconductor element. The wire is joined to the circuit pattern. The electrode terminal is joined to the wire. The semiconductor element is joined to the circuit pattern. The electrode terminal includes a horizontally extending portion extending along a main surface and connected to the wire, and a bent portion at which an extending direction of the electrode terminal is changed relative to the horizontally extending portion. The wire has a joint portion at which the wire and the circuit pattern are joined to each other. In a plan view, the joint portion is located on an outside of a portion where the wire and the electrode terminal overlap each other.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7A is a schematic plan view of a joint portion of a conductive member to a semiconductor element in a semiconductor device according to a comparative example.

FIG. 7B is a schematic cross-sectional view of a portion taken along a line VIIB-VIIB in FIG. 7A.

DESCRIPTION OF THE PREFERRED EMBODIMENTS

The embodiments of the present invention will be hereinafter described with reference to the accompanying drawings.

First Embodiment

The configuration of a semiconductor device of the present embodiment will be hereinafter described with reference to FIGS. 1 to 5. In addition, the X direction, the Y direction and the Z direction are introduced for the sake of explanation.

Figure 1:
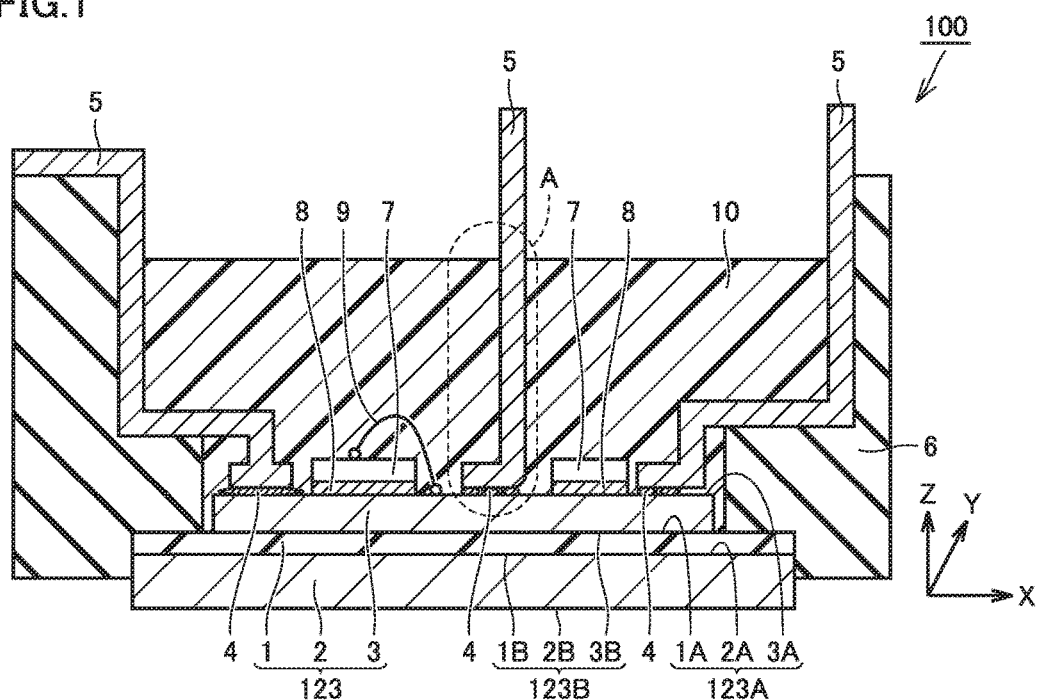
FIG. 1 is a schematic cross-sectional view showing the internal configuration of a semiconductor device according to the first embodiment.

Referring to FIG. 1, a semiconductor device 100 of the present embodiment mainly includes an insulating substrate 1, a base plate 2, a circuit pattern 3, a wire 4, an electrode terminal 5, a case 6, and a semiconductor element 7.

Insulating substrate 1 is formed of an insulating material such as commonly-known ceramics or resin, and is provided as a flat plate-shaped member, for example, having a rectangular shape in a plan view. Insulating substrate 1 has one main surface 1A on the upper side in FIG. 1 and the other main surface 1B on the opposite side of this one main surface 1A, that is, on the lower side in FIG. 1. Base plate 2 is formed in a rectangular flat plate shape and joined to the other main surface 1B of insulating substrate 1. Also, base plate 2 has one main surface 2A and the other main surface 2B on the opposite side thereof. Circuit pattern 3 is formed in a rectangular flat plate shape and joined to one main surface 1A of insulating substrate 1. Also, circuit pattern 3 has one main surface 3A and the other main surface 3B on the opposite side thereof. In other words, circuit pattern 3 is formed on one main surface 1A of insulating substrate 1, and at least partially has conductivity. Insulating substrate 1, base plate 2 and circuit pattern 3 are integrally formed, thereby forming a single base substrate 123. In other words, circuit pattern 3 is incorporated into base substrate 123 to constitute a circuit within this base substrate 123. Also, this circuit pattern 3 is electrically connected to wire 4, electrode terminal 5 and the like.

Wire 4 is a thin line-shaped and conductive member that is joined to one main surface 3A of circuit pattern 3 by a commonly-known wire bonding step. At least one or more wires 4 are joined to circuit pattern 3. In FIG. 1, a total of six wires 4 are joined, specifically, one wire 4 at the left end, three wires 4 in the center portion, and two wires 4 at the right end with respect to the X direction on circuit pattern 3.

It is preferable that wire 4 is made of a material including impurities containing copper, aluminum or silver. In other words, wire 4 is made of materials containing (i) copper, aluminum or silver and (ii) a material other than (i). When wire 4 is for example made of a material containing copper, wire 4 may be formed only of a material containing copper, or wire 4 may be formed by coating a thin film containing copper on the surface of a base material containing copper. The same may apply to the case where wire 4 is made of a material containing aluminum or a material containing silver.

Electrode terminal 5 is a member for electrically connecting circuit pattern 3 and wire 4 within semiconductor device 100 to the outside of semiconductor device 100. Three electrode terminals 5 are arranged in FIG. 1. Among these three electrode terminals 5 in FIG. 1, electrode terminal 5 on the leftmost side and electrode terminal 5 on the rightmost side are bent to conform to the shape of the inner wall surface of case 6 so as to extend to contact the inner wall surface of case 6. Among these three electrode terminals 5, electrode terminal 5 at the center in the X direction in FIG. 1 has a portion extending in this X direction at its lower end in FIG. 1, but most part of this electrode terminal 5 at the center extends in the upward and downward direction in FIG. 1, that is, in the Z direction. Thus, electrode terminal 5 at the center extends from the region on the inside of case 6 to the region on the outside of case 6.

Case 6 is arranged in the outermost region of the entire semiconductor device 100 as seen in plan view so as to entirely surround semiconductor device 100. As shown in the figure, case 6 may be formed so as to have an inner wall surface that is partially formed in a step-like shape. Furthermore, together with base substrate 123, case 6 constitutes a box-shaped member in which each member such as electrode terminal 5 can be housed. In FIG. 1, circuit pattern 3 in base substrate 123 is completely housed within case 6. Except for a part of its outer edge portion, insulating substrate 1 also overlaps the region surrounded by case 6 in planar view in such a manner that this insulating substrate 1 is housed in case 6. However, it is preferable that base plate 2 is configured such that at least the other main surface 2B is exposed from within case 6. In this way, for example, a heat dissipation member such as a heat sink can be placed on the other main surface 2B or the like of base plate 2.

Each of electrode terminals 5 described above is joined to wire 4. Specifically, each of electrode terminals 5 is joined to wire 4 so as to be overlaid thereon. Thereby, electrode terminals 5 are electrically connected to circuit pattern 3. As described above, this is because wire 4 is joined to circuit pattern 3.

Semiconductor element 7 is arranged on base substrate 123 within case 6, that is, on circuit pattern 3 within case 6. Specifically, semiconductor element 7 is joined onto one main surface 3A of circuit pattern 3 inside case 6 with a joint material 8 interposed therebetween. Semiconductor element 7 is a power semiconductor element such as a diode or an IGBT (Insulated Gate Bipolar Transistor), for example. Semiconductor element 7 and circuit pattern 3 are electrically connected to each other via a wire 9. Like wire 4, wire 9 is a thin line-shaped member that is joined by a commonly-known wire bonding step.

Semiconductor element 7 is formed in a chip shape, for example, having a square shape in a plan view. It is preferable that the chip is made of a material selected from the group consisting of silicon, silicon carbide, and gallium nitride.

Case 6 is filled with gel 10. Thereby, each member other than electrode terminals 5 within case 6 is buried in gel 10. However, electrode terminals 5 are arranged so as to extend from the region within gel 10 to the region on the outside of gel 10.

Figure 2:
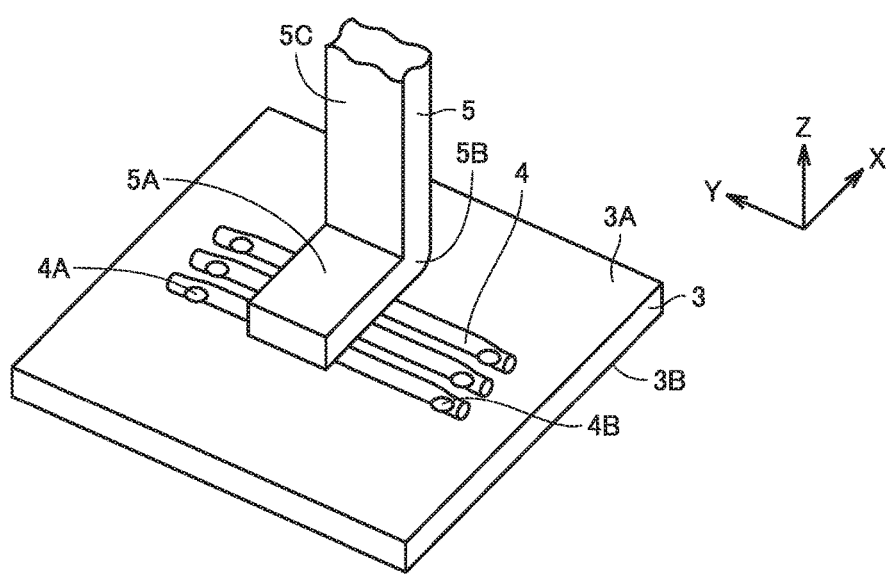
FIG. 2 is a schematic enlarged perspective view of a region A surrounded by a dotted line in FIG. 1 in the first embodiment.

Then, an explanation will be hereinafter given with reference to FIGS. 2 and 3 with regard to a region A surrounded by a dotted line in FIG. 1, that is, the manner in which electrode terminal 5 at the center in FIG. 1 is joined to circuit pattern 3. Referring to FIG. 2, electrode terminal 5 has: a horizontally extending portion 5A that extends in an X-Y plane so as to extend along one main surface 1A of insulating substrate 1 and one main surface 3A of circuit pattern 3; a bent portion 5B at which the extending direction of the center electrode terminal 5 is changed relative to horizontally extending portion 5A; and a vertically extending portion 5C that extends in the Z direction on the opposite side of horizontally extending portion 5A with respect to bent portion 5B. Bent portion 5B is arranged so as to be aligned with horizontally extending portion 5A in the X direction, and located on the positive side of horizontally extending portion 5A in the X direction. Vertically extending portion 5C is arranged directly above bent portion 5B generally in the Z direction. Specifically, horizontally extending portion 5A is arranged below vertically extending portion 5C, that is, arranged on the circuit pattern 3 side, and this horizontally extending portion 5A is connected to wire 4. It is to be noted that the shape of electrode terminal 5 shown in FIG. 2 is merely by way of example, and this electrode terminal 5 is not necessarily formed in a shape having horizontally extending portion 5A, bent portion 5B and vertically extending portion 5C.

In FIGS. 1 and 2, the number of wires 4 connected to electrode terminal 5 is three. In this way, it is preferable that a plurality of wires 4 are arranged, but a single wire 4 may be arranged. Wires 4 extend in the Y direction (the direction that crosses the direction connecting horizontally extending portion 5A and bent portion 5B), for example, so as to be spaced apart from each other in the X direction. Wire 4 has joint portions 4A and 4B at its both ends in the Y direction in which wire 4 extends. Wire is joined at these joint portions 4A and 4B to one main surface 3A of circuit pattern 3.

Electrode terminal 5 is placed so as to be overlaid approximately on the center portion in the direction in which wire 4 extends. Also, this electrode terminal 5 is joined at its lowermost surface to wire 4. As seen in plan view, joint portions 4A and 4B at which wire 4 is joined to circuit pattern 3 are located on the outside of the portion where wire 4 and electrode terminal 5 overlap each other.

Joint portions 4A and 4B of wire 4 to circuit pattern 3 are provided at two or more positions so as to be spaced apart from each other. In other words, wire 4 may be joined to circuit pattern 3 at two positions of joint portions 4A and 4B as shown in FIG. 2. However, wire 4 may have another joint portion to circuit pattern 3, for example, in a region located on the inside of joint portions 4A and 4B but on the outside of a portion where wire 4 and electrode terminal 5 overlap each other. In this case, wire 4 is to be joined at three or more joint portions to circuit pattern 3.

Joint portions 4A and 4B are located on the horizontally extending portion 5A side with respect to bent portion 5B in the X direction connecting horizontally extending portion 5A and bent portion 5B, that is, on the negative side in the X direction. Accordingly, in the present embodiment, wire 4 extends so as to overlap horizontally extending portion 5A of the entire electrode terminal 5.

Figure 3A:
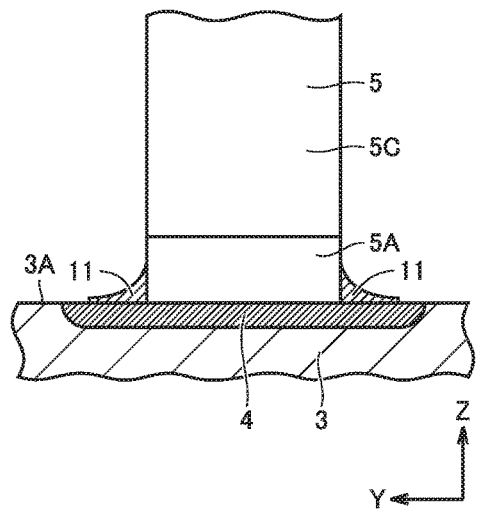
FIG. 3A is a front view of an electrode terminal shown in FIG. 2 seen in the X direction.
Figure 3B:
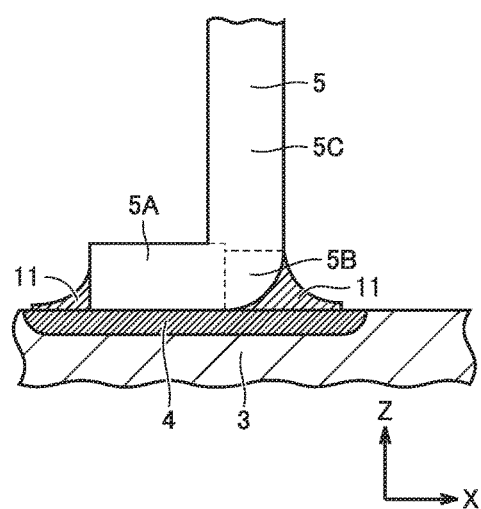
FIG. 3B is a front view of the electrode terminal shown in FIG. 2 seen in the Y direction.

FIG. 3A is a front view of electrode terminal 5 in FIG. 2 as seen from the negative side in the X direction, and FIG. 3B is a front view of electrode terminal 5 in FIG. 2 as seen from the negative side in the Y direction. Referring to FIGS. 3A and 3B, wire 4 and electrode terminal 5 located directly thereon are joined to each other through formation of a fillet 11. Fillet 11 is formed so as to overflow to the outside from the state where a part of wire 4 is sandwiched between circuit pattern 3 and electrode terminal 5 in the joining step. Fillet 11 is formed so as to cover the side surface of the lowermost region of electrode terminal 5. While fillet 11 is made of the same material as that of wire 4, this fillet 11 may be made of the material obtained by mixing the material of wire 4 and the material of electrode terminal 5. Although not shown, also between circuit pattern 3 and wire 4, the metal material forming circuit pattern 3 and the metal material forming wire 4 are melted and coupled to each other in the same manner as with fillet 11.

In FIG. 3B, dotted lines show a boundary between horizontally extending portion 5A and bent portion 5B, and a boundary between bent portion 5B and vertically extending portion 5C. As shown in FIG. 3B, horizontally extending portion 5A is assumed to be a region of electrode terminal 5 that excludes bent portion 5B in the X direction, that has a lowermost surface overlapping the horizontally extending region, and that extends below the uppermost surface of its horizontally extending flat plane portion. Bent portion 5B is assumed to be a region of electrode terminal 5 that extends so as to rise upward in the Z direction with respect to the horizontal direction in the X direction and that extends so as to bend to the left in the X direction with respect to the vertical direction in the Z direction. Vertically extending portion 5C is assumed to be a region of electrode terminal 5 that excludes horizontally extending portion 5A and bent portion 5B, and that overlaps a region basically extending upward in the Z direction.

It is preferable that circuit pattern 3 and electrode terminal 5 each are made of a copper-based or an aluminum-based base material. In this case, circuit pattern 3 and electrode terminal 5 each are made of a copper-based base material, which means that circuit pattern 3 and electrode terminal 5 each are made only of copper, and also means that circuit pattern 3 and electrode terminal 5 each are formed so as to contain both of copper and a material other than copper. Similarly, circuit pattern 3 and electrode terminal 5 each are made of an aluminum-based base material, which means that circuit pattern 3 and electrode terminal 5 each are made only of aluminum, and also means that circuit pattern 3 and electrode terminal 5 each are formed so as to contain both of aluminum and a material other than aluminum.

Also, it is preferable that the copper-based base material forming circuit pattern 3 and electrode terminal 5 contains 80 mass % or more and 100 mass % or less of copper, or the aluminum-based base material forming circuit pattern 3 and electrode terminal 5 contains 90 mass % or more and 100 mass % or less of aluminum. For example, when circuit pattern 3 and electrode terminal 5 each are formed only of a single member (base material), this single member is entirely formed of a material containing 80 mass % or more and 100 mass % or less of copper or a material containing 90 mass % or more and 100 mass % or less of aluminum. In addition, the base material forming circuit pattern 3 and electrode terminal 5 may be made of a silver-based material, in which case the base material contains 80 mass % or more and 90 mass % or less of silver. In this case, it is preferable that each of horizontally extending portion 5A, bent portion 5B and vertically extending portion 5C in electrode terminal 5 is similarly made of the above-described material.

Copper or aluminum contained in wire 4 is less in content than copper or aluminum contained in circuit pattern 3 and electrode terminal 5. Accordingly, the diffusion temperature of the material forming wire 4 is lower than the diffusion temperature of the base material forming each of circuit pattern 3 and electrode terminal 5. In other words, wire 4 made of the material lower in diffusion temperature than circuit pattern 3 is sandwiched between circuit pattern 3 and electrode terminal 5 each having a higher diffusion temperature, in which state wire 4 is joined to circuit pattern 3 and electrode terminal 5. In this case, the diffusion temperature means the heating temperature at the point of time when the base material or the material is started to melt and started to spread from the original position. Thereby, these materials can be joined to each other with lower energy.

Furthermore, when wire 4 is formed of the material made of impurities containing copper, aluminum or silver, this wire 4 is to be formed of the material that is lower in melting point than pure copper and higher in melting point than solder. Thereby, semiconductor device 100 can be operated on the higher temperature conditions, for example, as compared with the case where solder is joined in place of wire 4 onto circuit pattern 3 and the like. Particularly when semiconductor element 7 is formed of silicon carbide, semiconductor element 7 is required to be operated on the high temperature conditions. Accordingly, it is more effective that wire 4 is formed of the material that is higher in melting point than solder.

Figure 4:
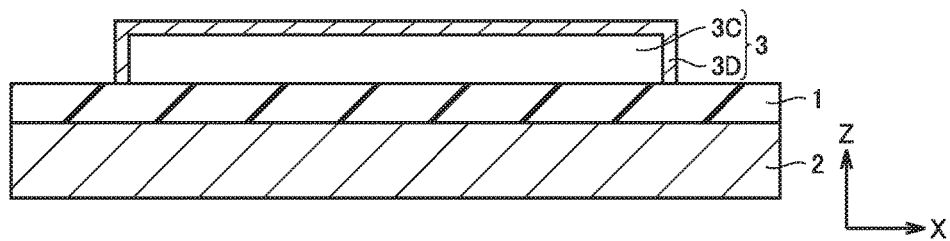
FIG. 4 is a schematic cross-sectional view showing the configuration of a modification of a circuit pattern in FIG. 1.
Figure 5:
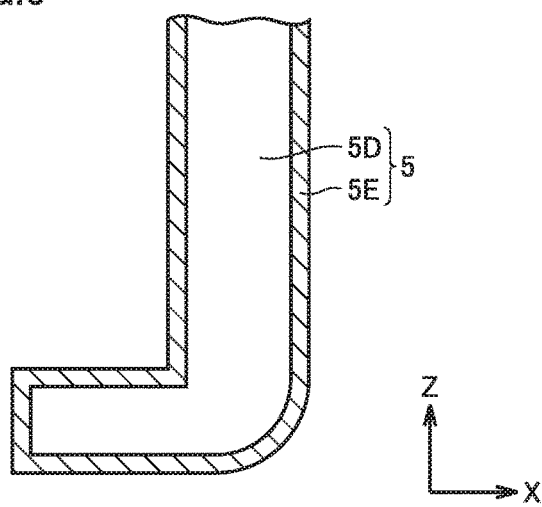
FIG. 5 is a schematic cross-sectional view showing the configuration of a modification of an electrode terminal in FIG. 1.

The above description explains the case where circuit pattern 3 and electrode terminal 5 each are entirely formed only of a single copper-based or aluminum-based base material. However, as shown in FIGS. 4 and 5 described below, it is also assumed that still another member is provided on the surface of the base material. FIG. 4 shows a modification of circuit pattern 3, and FIG. 5 shows a modification of electrode terminal 5. Referring to FIG. 4, for example, circuit pattern 3 may be a two-layer structure formed by a circuit pattern base material 3C as a base material and a circuit pattern thin film 3D as the first thin film formed on the surface of circuit pattern base material 3C. In this case, it is preferable as described above that circuit pattern base material 3C is made of a copper-based material, that is, contains 80 mass % or more and 100 mass % or less of copper, or made of an aluminum-based material, that is, contains 90 mass % or more and 100 mass % or less of aluminum. Furthermore, it is preferable that circuit pattern thin film 3D is one selected from the group consisting of a copper-based plating film, a nickel-based plating film and an aluminum-based coating film. The aluminum-based coating film as circuit pattern thin film 3D is formed by commonly-known methods such as vapor deposition or sputtering.

Referring to FIG. 5, for example, electrode terminal 5 may be a two-layer structure formed by an electrode terminal base material 5D as a base material and an electrode terminal thin film 5E as the second thin film formed on the surface of electrode terminal base material 5D. In this case, it is preferable as described above that electrode terminal base material 5D is made of a copper-based material, that is, contains 80 mass % or more and 100 mass % or less of copper, or made of an aluminum-based material, that is, contains 90 mass % or more and 100 mass % or less of aluminum. Furthermore, it is preferable that electrode terminal thin film 5E is one selected from the group consisting of a copper-based plating film, a nickel-based plating film, and an aluminum-based coating film. The aluminum-based coating film as electrode terminal thin film 5E is formed by commonly-known methods such as vapor deposition or sputtering.

As shown in FIG. 5, it is preferable that each of horizontally extending portion 5A, bent portion 5B and vertically extending portion 5C in electrode terminal 5 is similarly formed by the above-described two-layer structure.

When circuit pattern 3 and electrode terminal 5 each have a two-layer structure as shown in FIGS. 4 and 5 described above, circuit pattern 3 and electrode terminal 5 can be joined also onto the insulating materials such as insulating substrate 1 and case 6 by the first or second thin film made of a metal material formed on the base material. However, the first or second thin film is broken at the time when wire 4 is joined to circuit pattern 3 and electrode terminal 5 (using ultrasonic vibrations as described later), with the result that the broken thin film merely exists inside the joined portion.

Figure 6:
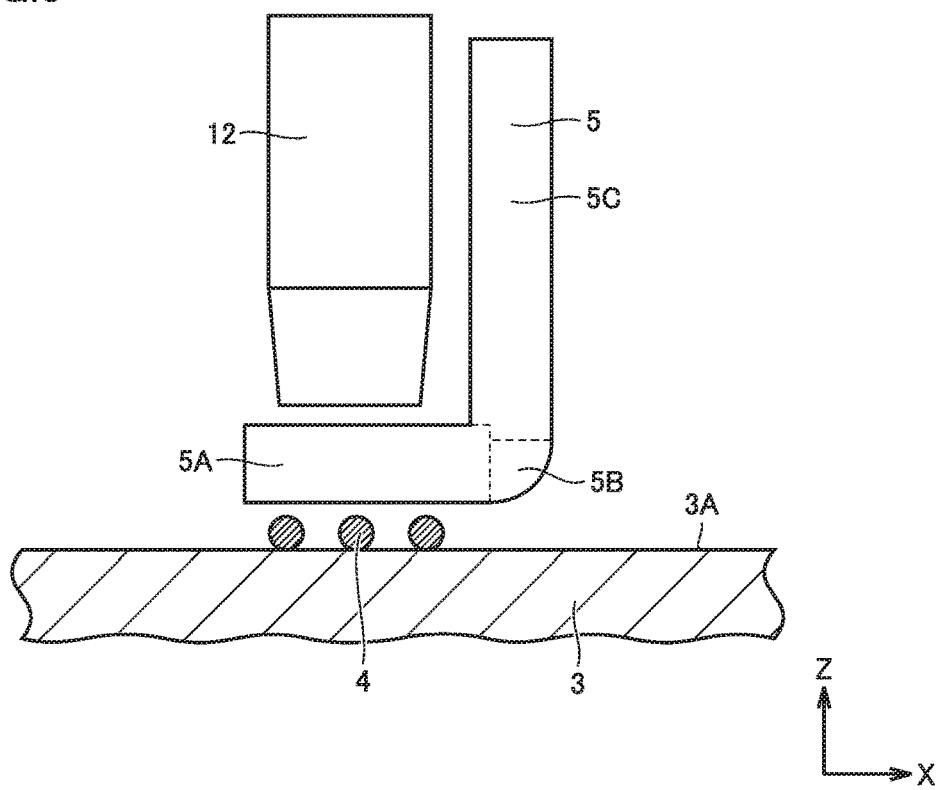
FIG. 6 is a schematic cross-sectional view showing the manner in which the electrode terminal is ultrasonic-joined through a wire onto the circuit pattern in the first embodiment.

The following is an explanation as to how to achieve the configuration in which circuit pattern 3 and electrode terminal 5 are joined with wire 4 interposed therebetween, as shown in FIGS. 1 to 3. Referring to FIG. 6, for example, at least one or more wires 4 extending in the Y direction are first joined by bonding onto one main surface 3A of circuit pattern 3. Each wire 4 is bonded such that joint portions 4A and 4B are located on the outside of the portion where each wire 4 overlaps electrode terminal 5 to be placed thereon. Electrode terminal 5 is then placed on each wire 4. In this case, electrode terminal 5 is placed particularly such that horizontally extending portion 5A overlaps and contacts each wire 4 in a planar manner.

In this state, an ultrasonic joining machine 12 is brought into contact with the uppermost surface of horizontally extending portion 5A. Then, ultrasonic vibrations are applied by this ultrasonic jointing machine 12. Thereby, vibrations are applied to the contact portions of horizontally extending portion 5A, wire 4 and circuit pattern 3, which are then melted to form fillet 11 shown in FIG. 3, so that horizontally extending portion 5A, wire 4 and circuit pattern 3 are metal-joined to one another.

Then, the functions and effects of the present embodiment will be hereinafter described while describing a comparative example of the present embodiment.

FIGS. 7A and 7B are a plan view and a cross-sectional view, respectively, of a portion shown in FIG. 2 of the present embodiment in a semiconductor device of a comparative example. Referring to FIGS. 7A and 7B, in the comparative example of the present embodiment, for example, a conductive member 13 such as a lead frame is joined via a bump 14 onto the surface of a semiconductor element 7 similar to that in the present embodiment. In other words, semiconductor element 7, bump 14 located thereon and conductive member 13 located thereon correspond to circuit pattern 3, wire 4 and electrode terminal 5, respectively, in FIG. 2. Also in this case, conductive member 13 is joined onto semiconductor element 7 using an ultrasonic joining machine.

Particularly as shown in FIG. 7A, conductive member 13 is processed to have a comb shape having a plurality of cutout portions in a portion at which this conductive member 13 is joined to bump 14 for the purpose of facilitating absorption and alleviation of the thermal stress. In this case, particularly as shown in FIG. 7B, this comb-shaped conductive member 13 is difficult to be processed such that the elongated comb-shaped portions have the same shape and the same size. Thus, these elongated comb-shaped portions are different in position and planar shape in the Z direction. This causes variations in thickness of bumps 14, for example, made of aluminum and arranged between conductive member 13 and semiconductor element 7. Thus, the heat dissipation performance from conductive member 13 to semiconductor element 7 may be different from the design value. Also, when the positions of the comb-shaped portions in conductive member 13 are greatly different in the Z direction, some comb-shaped portions are sufficiently ultrasonic-joined while other comb-shaped portions are not ultrasonic-joined. In this case, the comb-shaped portions that are not ultrasonic-joined do not have conductivity to semiconductor element 7 through bump 14, which may lead to production of defective products. Thus, such thickness variations in bumps 14 may significantly decrease the reliability of the entire semiconductor device.

Accordingly, it is conceivable that, without using comb-shaped conductive member 13, electrode terminal 5 for external connection is formed as in the present embodiment, and then ultrasonic-joined to circuit pattern 3 of base substrate 123 through wire 4. However, also in this case, as in the initial state shown in (1) of FIG. 8, when the length of wire 4 extending in the X direction is not sufficient so that both ends (joint portions 4A and 4B) of wire 4 to be joined to circuit pattern 3 are located within a region overlapping electrode terminal 5, the following problems may occur.

Figure 8:
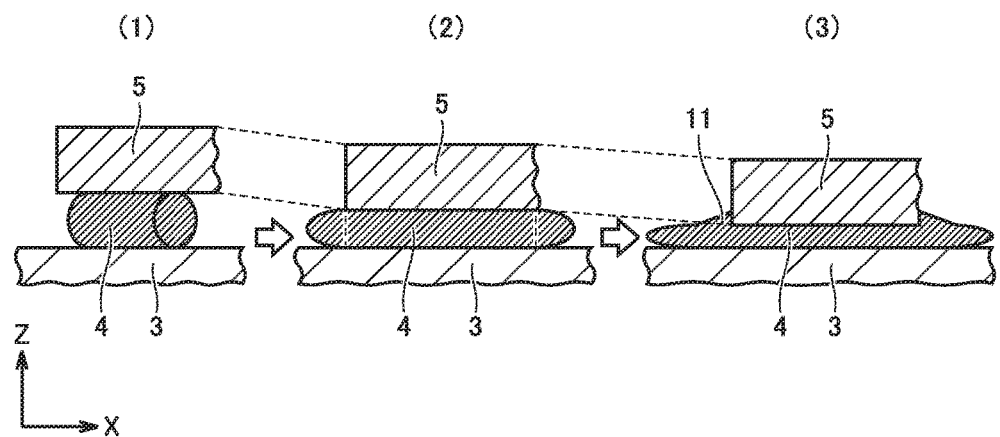
FIG. 8 is a schematic cross-sectional view showing the manner in which an electrode terminal and a circuit pattern are joined through a wire in the case where both ends of the wire are located to overlap the electrode terminal in the comparative example.

Specifically, as shown in (2) in FIG. 8, there is a process of crushing wire 4 while pushing electrode terminal 5 downward in the Z direction when electrode terminal 5 on wire 4 bonded thereto is ultrasonic-joined. In this process, wire 4 gradually comes to extend beyond electrode terminal 5 to the outside in a plan view. When this process then further progresses, the portion of wire 4 that extends beyond electrode terminal 5 is melted to form fillet 11 as shown in (3) in FIG. 8. If both ends of wire 4 are already located on the outside of electrode terminal 5 in the initial state, fillet 11 can be more smoothly formed to have an excellent shape. This is because it becomes necessary to apply stronger pressing force for crushing wire 4 in order to form fillet 11 when both ends of wire 4 are located on the outside of electrode terminal 5 than when both ends of wire 4 are located on the inside of electrode terminal 5. Furthermore, fillet 11 can be formed larger and the joining force can be stronger when both ends of wire 4 are located on the outside of electrode terminal 5 than when both ends of wire 4 are located on the inside of electrode terminal 5. From this point of view, it is preferable that the joint portion of wire 4 to circuit pattern 3 is located on the outside of electrode terminal 5.

Figure 9:
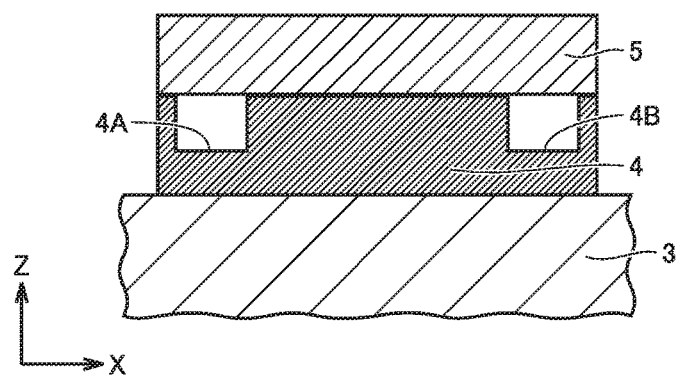
FIG. 9 is a schematic cross-sectional view showing the positional relation between the joint portion of the wire and each of the electrode terminal and a circuit pattern in the case where both ends of the wire are located to overlap the electrode terminal in the comparative example.

Also from the different points of view, referring to FIG. 9, when joint portions 4A and 4B of wire 4 to circuit pattern 3 overlap electrode terminal 5, joint portions 4A and 4B in wire 4 do not contact electrode terminal 5 provided thereon. This is because wire 4 is less in thickness in the Z direction at its bonded joint portions 4A and 4B than its original thickness. Accordingly, as shown in FIG. 9, wire 4 cannot be joined at its joint portions 4A and 4B to electrode terminal 5, so that the area of each joining portion between wire 4 and electrode terminal 5 is reduced. Consequently, the electrical conductivity and the heat dissipation performance from electrode terminal 5 to wire 4 may be lowered. Furthermore, the thickness of wire 4 directly below electrode terminal 5 varies between joint portions 4A, 4B and portions other than these joint portions 4A, 4B, which may also decrease the electrical conductivity and the heat dissipation performance from electrode terminal 5 to wire 4.

In view of the above-described problems, in the present embodiment, joint portions 4A and 4B at which circuit pattern 3 and wire 4 are joined to each other are arranged on the outside of a portion where wire 4 and electrode terminal 5 overlap each other, in a plan view as shown in FIG. 2. Thereby, when electrode terminal 5 is ultrasonic-joined onto wire 4, the entire thickness of wire 4 directly below electrode terminal 5 can be set at an almost fixed value without variation. Although the thickness of wire 4 located directly below electrode terminal 5 is different from the thickness of wire 4 located in other regions, any region in wire 4 located at least directly below electrode terminal 5 has an almost uniform thickness without variation. This is because horizontally extending portion 5A extends in the horizontal direction and also because joint portions 4A and 4B do not exist directly below electrode terminal 5.

Thereby, electrode terminal 5 and wire 4 can be entirely excellently joined to each other, so that the excellent electrical conductivity and the heat dissipation performance between electrode terminal 5 and wire 4 can be ensured. Furthermore, since fillet 11 can be readily formed on the side surface of electrode terminal 5, the metal-to-metal joint formed between electrode terminal 5 and wire 4 is strengthened, which also can increase the reliability of the electrical conductivity between electrode terminal 5 and wire 4.

Since the heat dissipation performance can be raised, the thermal stress between electrode terminal 5 and wire 4 can be alleviated, so that the reliability of the strength and the like of the joining portion between electrode terminal 5 and circuit pattern 3 can be raised. Therefore, the life of semiconductor device 100 can be lengthened.

Furthermore, horizontally extending portion 5A of electrode terminal 5 does not have a cutout portion, and has an end face extending in a linear shape without being bent in a plan view. Accordingly, the contact area between electrode terminal 5 and wire 4 is not needlessly reduced. Thus, reduction of the current amount between electrode terminal 5 and wire 4 can be suppressed. Therefore, even if electrode terminal 5 included in semiconductor device 100 is reduced in size, the sufficient current amount can be ensured, so that semiconductor device 100 can also be reduced in size.

Then, if wire 4 is joined only at one position to circuit pattern 3, this wire 4 may be raised, displaced or rotated from circuit pattern 3 during the subsequent joining of electrode terminal 5. Consequently, the accuracy, the strength and the like at the joint position between electrode terminal 5 and wire 4 may deteriorate. In contrast, if wire 4 is fixed at two positions to circuit pattern 3 in advance, it becomes possible to highly accurately control the joint position and the strength between wire 4 and electrode terminal 5 during the subsequent joining of electrode terminal 5. Essentially, in a wire bonding step, wire 4 is joined at joint portion 4A, at which wire 4 is cut, and at joint portion 4B at a distance therefrom, wire 4 is also joined, at which wire 4 is again cut. Accordingly, wire 4 is joined at two or more positions to circuit pattern 3 inevitably when a wire bonding step is performed.

Furthermore, in the X direction connecting horizontally extending portion 5A and bent portion 5B, joint portions 4A and 4B are arranged on the horizontally extending portion 5A side with respect to bent portion 5B, that is, arranged on the negative side in the X direction. Thereby, horizontally extending portion 5A of electrode terminal 5 and wire 4 are brought into contact with each other in the entire region where electrode terminal 5 and wire 4 overlap each other. Accordingly, when the pressing force and the like from ultrasonic joining machine 12 is applied to horizontally extending portion 5A, ultrasonic joining vibrations can be readily transmitted to the entire wire 4. Thus, wire 4 is reliably joined to electrode terminal 5 in the entire region where this wire 4 overlaps electrode terminal 5, so that excellent electrical conductivity and heat dissipation performance between wire 4 and electrode terminal 5 can be ensured.

In addition, since ultrasonic vibrations of ultrasonic joining machine 12 are applied to horizontally extending portion 5A of electrode terminal 5, such ultrasonic vibrations can be readily transmitted from horizontally extending portion 5A to bent portion 5B. Accordingly, in the present embodiment, fillet 11 is formed also between bent portion 5B and wire 4 as shown in FIG. 3, so that bent portion 5B and circuit pattern 3 can be excellently joined to each other.

Second Embodiment

Figure 10:
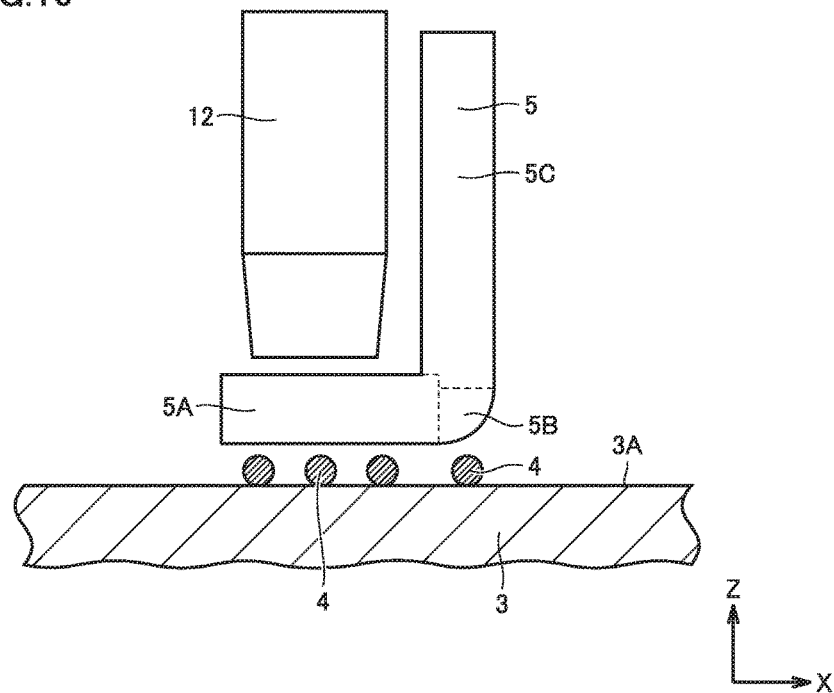
FIG. 10 is a schematic cross-sectional view showing the manner in which an electrode terminal is ultrasonic-joined through a wire onto a circuit pattern in the second embodiment.

Referring to FIG. 10, also in the semiconductor device of the present embodiment, electrode terminal 5, wire 4 and circuit pattern 3 are joined to each other using ultrasonic joining machine 12, as in the semiconductor device of the first embodiment. Also in the semiconductor device of the present embodiment, all of the plurality of wires 4 extend in the Y direction, for example, so as to be spaced apart from each other in the X direction. However, when comparing FIG. 10 with FIG. 6, in the present embodiment, at least one of the plurality of wires 4 is arranged so as to extend in the region overlapping bent portion 5B in a plan view. In this point, the present embodiment is different from the first embodiment in which all of the plurality of wires 4 are arranged so as to extend in the region overlapping horizontally extending portion 5A in a plan view. Also in the present embodiment, as shown in FIG. 10, for example, one of the plurality of wires 4 extends in the region overlapping bent portion 5B in a plan view, but other wires 4 may be arranged so as to extend in the region overlapping horizontally extending portion 5A in a plan view as in the first embodiment.

Figure 11A:
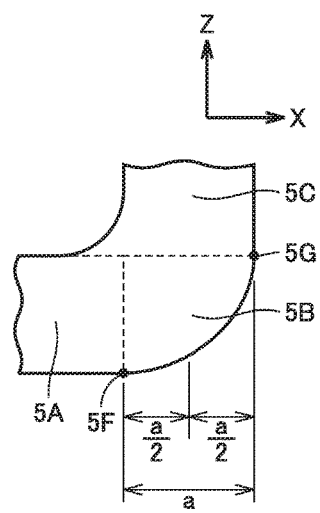
FIG. 11A is a schematic diagram illustrating a range of one-half of the bending size of a bent portion.
Figure 11B:
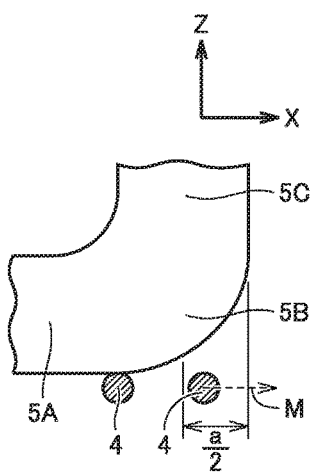
FIG. 11B is a schematic diagram showing the first example of the manner in which a wire is arranged in a portion corresponding to one-half of the bending size.
Figure 11C:
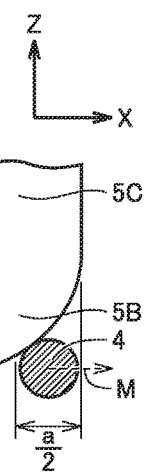
FIG. 11C is a schematic diagram showing the second example of the manner in which the wire is arranged in a portion corresponding to one-half of the bending size.

FIGS. 11A to 11C each show an enlarged bent portion. As described above, bent portion 5B corresponds to a region of electrode terminal 5 that extends so as to be raised upward in the Z direction with respect to the horizontal direction in the X direction, and that extends so as to be bent to the left in the X direction with respect to the vertical direction in the Z direction. In other words, referring to FIG. 11A, bent portion 5B is a region surrounded by a dotted line in the figure and corresponding to a region delimited by a curved surface as a boundary starting from a lowermost point 5F in the lowermost portion in the Z direction to an uppermost point 5G in the uppermost portion in the Z direction. The dimension from lowermost point 5F to uppermost point 5G in the X direction is defined as a bending size, which is herein expressed by "a". Also in the following description, ½ of the bending size means a dimension of a/2, which means the midpoint in the bent portion, at which the dimension from each of lowermost point 5F and uppermost point 5G in the X direction is a/2, as shown in the figure. Furthermore, the region having a bending size of ½ or less means particularly a region in electrode terminal 5 where the distance from uppermost point 5G in the X direction is a/2 or less.

Referring to FIG. 11B, since horizontally extending portion 5A readily comes in contact with wire 4 located directly therebelow, ultrasonic joining vibrations are readily transmitted to wire 4, thereby reliably implementing metal-to-metal joining between electrode terminal 5 and wire 4. In contrast, since bent portion 5B has a lowermost surface formed in a curved surface for the convenience of the manufacturing process, the position of this lowermost surface is located higher in the Z direction than horizontally extending portion 5A. Accordingly, wire 4 directly below bent portion 5B is out of contact with bent portion 5B. Then, since wire 4 directly below bent portion 5B does not receive the pressing force from bent portion 5B, this wire 4 can be readily moved in the direction indicated by an arrow M in the figure in the previous stage of ultrasonic joining of electrode terminal 5, that is, in the state immediately after wire bonding is performed, for example. This phenomenon is more likely to occur particularly in a region where the bending size is ½ or less.

Referring to FIG. 11C, also in the case where the cross-sectional area of wire 4 is relatively large and wire 4 in the region having a bending size of ½ or less contacts bent portion 5B, this wire 4 may be moved in the direction indicated by arrow M in the figure along the lowermost surface of bent portion 5B due to the downward pressing force and the like of electrode terminal 5. Due to this movement, wire 4 is not located directly below bent portion 5B, so that wire 4 is not crushed by the pressing force from above. Thus, melting and fillet formation do not occur.

In this case, even if ultrasonic vibrations are applied, wire 4 is not joined to electrode terminal 5 because wire 4 essentially does not contact electrode terminal 5, and also, this wire 4 is not joined to circuit pattern 3. Thus, wire 4 may become a defective product.

Figure 12A:
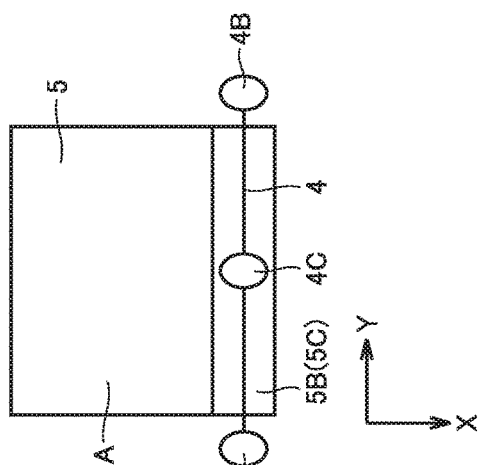
FIG. 12A is a schematic plan view showing the first example of the positional relation in a plan view between joint portions of the wire and the electrode terminal in the second embodiment.
Figure 12B:
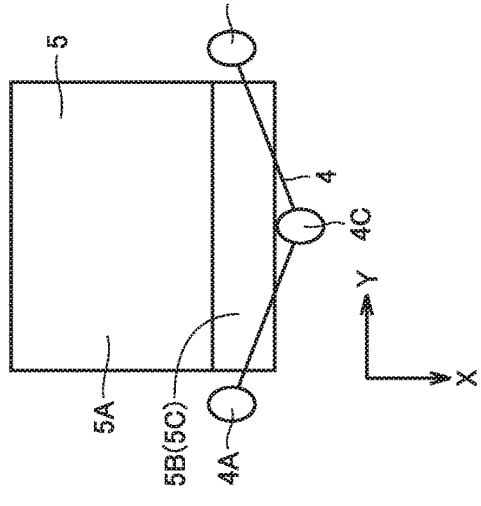
FIG. 12B is a schematic plan view showing the second example of the positional relation in a plan view between the joint portions of the wire and the electrode terminal in the second embodiment.
Figure 12C:
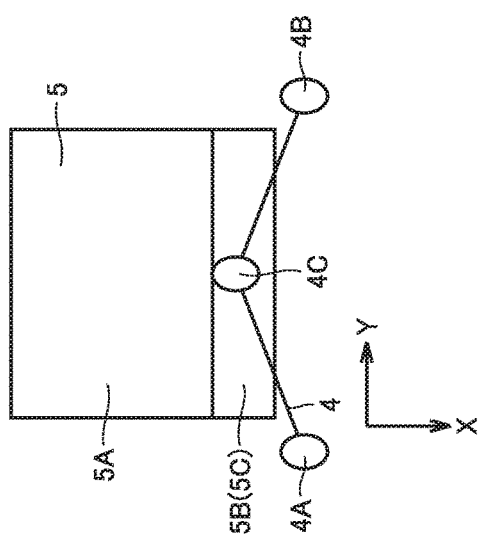
FIG. 12C is a schematic plan view showing the third example of the positional relation in a plan view between the joint portions of the wire and the electrode terminal in the second embodiment.

Accordingly, it is preferable that wire 4 located in the region overlapping bent portion 5B is provided with a joint portion also in a region overlapping bent portion 5B, in addition to two joint portions located in a region on the outside of the region overlapping electrode terminal 5. FIGS. 12A to 12C each are a plan view showing an example of the position of the joint portion in the case where wire 4 extends in a region overlapping bent portion 5B. Referring to FIG. 12A, for example, wire 4 may have joint portions 4A and 4B at its both ends on the positive side in the X direction with respect to bent portion 5B in the X direction, and also may have another joint portion 4C located between joint portions 4A and 4B and arranged in the region overlapping bent portion 5B. Alternatively, referring to FIG. 12B, wire 4 may have joint portions 4A and 4B at its both ends, for example, that are located at the same position in the X direction as that of bent portion 5B and arranged in the region on the outside of electrode terminal 5, and also may have another joint portion 4C located between joint portions 4A and 4B and arranged on the positive side in the X direction with respect to bent portion 5B. Further referring to FIG. 12C, wire 4 may be configured to extend entirely in a linear shape and exist in a region where joint portion 4C between joint portions 4A and 4B at both ends overlaps bent portion 5B.

Also in each of FIGS. 12A to 12C, when wire 4 is bonded to circuit pattern 3, wire 4 is first joined to joint portion 4A (4B), then joined to joint portion 4C, and finally, joined to joint portion 4B (4A).

Then, the functions and effects of the present embodiment will be described.

Generally, wire 4 cannot be joined to bent portion 5B as in the first embodiment. However, when wire 4 is arranged so as to extend in the region overlapping bent portion 5B in a plan view as in the present embodiment, wire 4 can be arranged as an indirect material also at least directly below bent portion 5B, irrespective of the shape of the curved surface of the lowermost surface of bent portion 5B.

In this case, joint portion 4C is provided between joint portions 4A and 4B at both ends. Thereby, also when a region of wire 4 that is located adjacent to joint portion 4C overlaps particularly a region of bent portion 5B that has a bending size of ½ or less, it becomes possible to suppress occurrence of defects that wire 4 is moved to the outside of bent portion 5B, separated from electrode terminal 5, and then cannot be connected to electrode terminal 5 and circuit pattern 3.

Also in this case, as in the first embodiment, since wire 4 is crushed and reduced in thickness at joint portion 4C, wire 4 may not be in contact at joint portion 4C with electrode terminal 5 located thereon. However, by fixing wire 4 to circuit pattern 3 at joint portion 4C, wire 4 and bent portion 5B can be joined to each other more reliably in a region of wire 4 at least excluding joint portion 4C and overlapping bent portion 5B than in the case where joint portion 4C is not provided.

Third Embodiment

Figure 13:
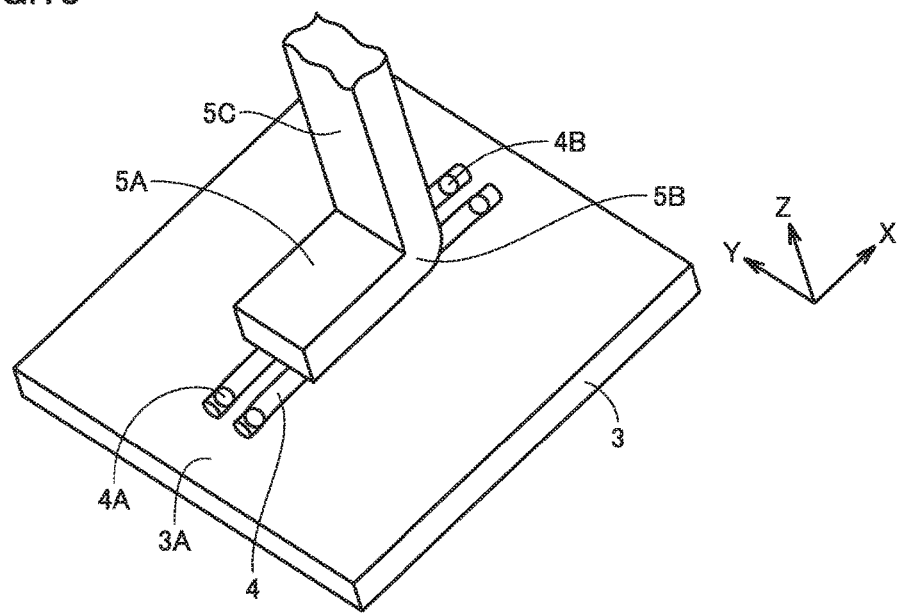
FIG. 13 is a schematic enlarged perspective view of a region A surrounded by a dotted line in FIG. 1 in the third embodiment.

Referring to FIG. 13, in the semiconductor device of the present embodiment, wire 4 extends in a direction different from that in the case of semiconductor device 100 of the first embodiment. Specifically, when comparing FIG. 13 with FIG. 2, in the present embodiment, wire 4 joined onto one main surface 3A of circuit pattern 3 extends in the X direction, that is, in the direction connecting horizontally extending portion 5A and bent portion 5B. In this point, the present third embodiment is different from the first embodiment shown in FIG. 2 in which wire 4 extends in the Y direction, that is, in the direction crossing the direction connecting horizontally extending portion 5A and bent portion 5B.

The semiconductor device of the present embodiment is different from that of the first embodiment only in the above-described point, but is identical in other points to that of the first embodiment. Accordingly, the same components are designated by the same reference characters, and a description thereof will not be repeated.

Then, the functions and effects of the present embodiment will be hereinafter described.

When wire 4 is arranged as shown in FIG. 13, wire 4 is arranged not only directly below horizontally extending portion 5A, but also directly below bent portion 5B. Furthermore, unlike the second embodiment, wire 4 extends in the direction connecting horizontally extending portion 5A and bent portion 5B. In other words, each wire 4 extends so as to be arranged directly below horizontally extending portion 5A and also directly below bent portion 5B. Accordingly, wire 4 is ultrasonic-joined in the state where this wire 4 is sufficiently positioned and temporarily fixed by the contact pressing force from horizontally extending portion 5A at least directly below horizontally extending portion 5A. Therefore, as in the second embodiment, it becomes possible to decrease the possibility that wire 4 is moved to the outside directly below bent portion 5B, so that wire 4 can be joined onto circuit pattern 3 with high positional accuracy.

The number of wires 4 and the cross-sectional area of wire 4 shown in each of the above-described embodiments can be changed as appropriate in accordance with the contact area between wire 4 and electrode terminal 5, the size of electrode terminal 5 and the size of base substrate 123 that are determined by the required current amount.

The characteristics described in (each example included in) each of the above embodiments may be applied so as to be combined as appropriate within the range where technical inconsistency does not occur.

Although the embodiments of the present invention have been described as above, it should be understood that the embodiments disclosed herein are illustrative and non-restrictive in every respect. The scope of the present invention is defined by the terms of the claims, and is intended to include any modifications within the meaning and scope equivalent to the terms of the claims.

What is claimed is:

1. A semiconductor device comprising:
   a circuit pattern formed on one main surface of an insulating substrate and at least partially having conductivity;
   at least one or more wires joined to the circuit pattern and having conductivity;
   an electrode terminal joined to the wires, thereby being electrically connected to the circuit pattern; and
   a semiconductor element joined to the circuit pattern,
   the electrode terminal including a horizontally extending portion extending along the one main surface and connected to the wires, and a bent portion at which an extending direction of the electrode terminal is changed relative to the horizontally extending portion,
   each of the wires having a joint portion at which each of the wires and the circuit pattern are joined to each other,
   in a plan view, the joint portion being located on an outside of a portion where each of the wires and the electrode terminal overlap each other.

2. The semiconductor device according to claim 1, wherein the joint portions are provided at two or more positions so as to be spaced apart from each other.

3. The semiconductor device according to claim 1, wherein the joint portion is arranged in a region on a side of the horizontally extending portion with respect to the bent portion in a direction connecting the horizontally extending portion and the bent portion.

4. The semiconductor device according to claim 1, wherein
   a plurality of the wires are arranged, and
   at least one of the wires is arranged so as to extend in a region overlapping the bent portion in a plan view.

5. The semiconductor device according to claim 1, wherein
   each of the wires is made of a material including impurities containing copper, aluminum or silver, and
   the material forming each of the wires is lower in diffusion temperature than a base material, forming each of the circuit pattern and the electrode terminal.

6. The semiconductor device according to claim 5, wherein
   the circuit pattern and the electrode terminal each are formed by the base material made of a copper-based material or an aluminum-based material, and
   the base material contains 80 mass % or more and 100 mass % or less of copper, or contains 90 mass % or more and 100 mass % or less of aluminum.

7. The semiconductor device according to claim 6, wherein
   the circuit pattern includes the base material and a first thin film formed on a surface of the base material, and
   the first thin film is one selected from the group consisting of a copper-based plating film, a nickel-based plating film and an aluminum-based coating film.

8. The semiconductor device according to claim 6, wherein
   the electrode terminal includes the base material and a second thin film formed on a surface of the base material, and
   the second thin film is one selected from the group consisting of a copper-based plating film, a nickel-based plating film and an aluminum-based coating film.

9. The semiconductor device according to claim 1, wherein the semiconductor element is made of one selected from the group consisting of silicon, silicon carbide and gallium nitride.

\* \* \* \* \*